(12) United States Patent
Wetzel et al.

(10) Patent No.: US 6,981,086 B2
(45) Date of Patent: Dec. 27, 2005

(54) INSTRUMENTATION SYSTEM INCLUDING A BACKPLANE HAVING A SWITCHED FABRIC BUS AND INSTRUMENTATION LINES

(75) Inventors: Mark Wetzel, Cedar Park, TX (US); Michel Haddad, Austin, TX (US); Joseph E. Peck, Round Rock, TX (US); Christopher A. Clark, Austin, TX (US)

(73) Assignee: National Instruments Corporation, Austin, TX (US)

( * ) Notice: Subject to any disclaimer, the term of this patent is extended or adjusted under 35 U.S.C. 154(b) by 476 days.

(21) Appl. No.: 10/014,638

(22) Filed: Oct. 26, 2001

(65) Prior Publication Data

US 2002/0080811 A1     Jun. 27, 2002

Related U.S. Application Data

(60) Provisional application No. 60/257,638, filed on Dec. 21, 2000.

(51) Int. Cl.⁷ ............................................. G06F 13/00
(52) U.S. Cl. ..................................... 710/300; 710/301
(58) Field of Search ................................ 710/300–304

(56) References Cited

U.S. PATENT DOCUMENTS

| | | | |
|---|---|---|---|
| 5,040,158 A * | 8/1991 | Lee et al. ...................... 368/10 |
| 5,414,635 A * | 5/1995 | Ohta .......................... 702/67 |
| 5,619,722 A * | 4/1997 | Lovrenich ..................... 710/2 |
| 6,243,787 B1 | 6/2001 | Kagan et al. |
| 6,349,286 B2 * | 2/2002 | Shaffer et al. .............. 704/503 |
| 6,351,786 B2 * | 2/2002 | Elmore et al. .............. 710/303 |
| 6,397,286 B1 * | 5/2002 | Chatenever et al. ........ 710/302 |
| 6,442,639 B1 * | 8/2002 | McElhattan et al. ........ 710/303 |
| 6,629,181 B1 * | 9/2003 | Alappat et al. ............. 710/300 |
| 6,640,273 B1 * | 10/2003 | Spisak et al. ............... 710/104 |
| 6,704,830 B1 * | 3/2004 | Spisak et al. ............... 710/305 |
| 6,715,023 B1 * | 3/2004 | Abu-Lebdeh et al. ....... 710/317 |
| 2001/0013100 A1 * | 8/2001 | Doblar et al. ............... 713/400 |

OTHER PUBLICATIONS

PXI Specification, Revision 1.0, Aug. 20, 1997, National Instruments.*
InfiniBand Architecture Specification, Release 1.0, Oct. 24, 2000, pp. 33-36, 54, 145-151, 262-273, 350-356.*

(Continued)

*Primary Examiner*—Rehana Perveen
*Assistant Examiner*—Trisha Vu
(74) *Attorney, Agent, or Firm*—Meyertons Hood Kivlin Kowert & Goetzel, P.C.; Jeffrey C. Hood; Mark S. Williams (57) ABSTRACT

An instrumentation system which extends channel-based switched fabric architectures to provide instrumentation signaling functions. The system comprises a chassis including slots for receiving inserted modules. The chassis includes a backplane which provides for inter-module communication, including a channel-based switched fabric bus, such as the InfiniBand bus, and instrumentation signaling lines for instrumentation signaling functions. The signaling lines may include a local bus for adjacent slot communication of analog and/or digital signals, reference clock lines for transmitting system reference clock signals to synchronize operations of inserted modules, a trigger bus including trigger lines which connect to corresponding slots to communicate trigger signals between the inserted modules for synchronizing operations between the modules, and/or a star trigger bus including dedicated trigger lines connecting a star trigger controller slot to each instrumentation slot for communicating precision trigger signals generated by an inserted star trigger controller module to the inserted modules.

39 Claims, 7 Drawing Sheets

OTHER PUBLICATIONS

National Instruments "The Measurement and Automation Catalog 2000," pp. 634-677.
www.infinibandta.org/ibta/ About InfiniBand® Trade Association: An InfiniBand™ Technology Overview, Sep. 30, 2002, 5 pages.
"The PXI Modular Instrumentation Architecture" white paper, Sep. 12, 2000, 8 pages.
PXI Systems Alliance, Specification PCI extensions for Instrumentation, Revision 2.0, Jul. 28, 2000, pp. 9-62.

* cited by examiner

INSTRUMENTATION SYSTEM INCLUDING A BACKPLANE HAVING A SWITCHED FABRIC BUS AND INSTRUMENTATION LINES

PRIORITY DATA

This application claims benefit of priority of U.S. provisional application Ser. No. 60/257,638 titled "INSTRUMENTATION SYSTEM INCLUDING A BACKPLANE HAVING A SWITCHED FABRIC BUS AND INSTRUMENTATION LINES" filed Dec. 21, 2000, whose inventors were Mark Wetzel and Michel Haddad.

FIELD OF THE INVENTION

The invention relates generally to networks and instrumentation, and specifically to instrumentation extensions to a channel-based switched fabric bus.

DESCRIPTION OF THE RELATED ART

An instrument may be defined as a device which collects data or information from an environment or unit under test and displays this information to a user. An instrument may also perform various data analysis and data processing on acquired data prior to displaying the data to the user. Examples of various types of instruments include oscilloscopes, digital multimeters, pressure sensors, image acquisition/machine vision devices, etc., and the types of information which might be collected by respective instruments include voltage, resistance, distance, velocity, pressure, frequency of oscillation, humidity, temperature, video, and audio, among others.

In the past, many instrumentation systems comprised individual instruments physically interconnected with each other. Each instrument typically included a physical front panel with its own peculiar combination of indicators, knobs, or switches. A user generally had to understand and manipulate individual controls for each instrument and record readings from an array of indicators. Acquisition and analysis of data in such instrumentation systems was tedious and error prone.

A significant advance occurred with the introduction of computers to provide more flexible means for interfacing instruments with a user. In such computerized instrumentation systems, the user interacts with software executing on the computer system through the computer's user interface, e.g., video monitor, mouse, keyboards, etc., rather than through a manually operated front panel to control one or more real world instruments. The software executing on the computer system can be used to simulate the operation of an instrument in software or to control or communicate with one or more traditional (i.e., real world) instruments, these software created/controlled instruments being referred to as virtual instruments.

Therefore, modem instrumentation systems are moving from dedicated stand-alone hardware instruments such as oscilloscopes, digital multimeters, etc., to a concept referred to as virtual instrumentation. Virtual instrumentation comprises general purpose personal computers and workstations combined with instrumentation software and hardware to build a complete instrumentation system. In a virtual instrumentation system, a virtual instrument operating on a central computer controls the constituent instruments from which it acquires data which it analyzes, stores, and presents to a user of the system. Computer control of instrumentation has become increasingly desirable in view of the increasing complexity and variety of instruments available for use, and computerized instrumentation systems provide significant performance efficiencies over earlier systems for linking and controlling test instruments.

Some of the various hardware interface options currently available for instrumentation systems include VXI bus instruments and PXI bus instruments. The VXI (VME eXtensions for Instrumentation) bus is a platform for instrumentation systems that was first introduced in 1987 and was originally designed as an extension of the VME bus standard, which is now standardized as IEEE 1014. The VME standard was developed by Motorola and a number of other companies in the late 1970s and has been widely accepted as a backplane standard for many electronic platforms. The VME standard defines the electrical and mechanical backplane characteristics of the VME bus that allow a wide variety of companies to develop products to work in a mix and match fashion to develop electronics systems.

The VXI bus, or VXI, is an instrumentation bus based on the VME bus, the Eurocard and standards such as IEEE 488.2 and the HP GPIB (General Purpose Instrumentation Bus). It is an open architecture and is useful for automated test systems and data collection. The VXI bus expands on the VME bus and so the two bus specifications are very similar. Transistor-Transistor Logic (TTL) and Emitter Coupled Logic (ECL) trigger lines, a local bus and an analogue summing bus are among the added features.

The VME standard was chosen as the basis for VXI because it had many desirable characteristics. It was a well recognized standard, and provided a platform that provided desired downsizing and speed, but was designed primarily for high speed digital communications. While the development of sophisticated test equipment required these characteristics; it also required the capability to handle low-level analog signals as well as very high frequency signals in the Radio Frequency (RF) and microwave frequency range. To allow low level signals to co-exist on a backplane with high speed digital and RF or microwave signals, the VME standard had to be enhanced to allow for shielding, both on the backplane and between the individual modules themselves.

To provide added shielding, the VXI specification increased the spacing between adjacent boards from 0.8 inch (the VME standard) to 1.2 inches. In addition, instrumentation modules require more power and a greater variety of available power. Therefore, five additional power supply voltages and additional grounding were added. Instrumentation requires additional control of trigger circuits, and often requires a standard clock, which were also added. Specifications on cooling and EMI/RFI were added to assure that instruments could plug-in and function without interference from adjacent modules. Finally, a software environment and wake up procedure were defined, again to insure interoperability of all modules.

The VXI standard has experienced tremendous growth and acceptance around the world and is used in a wide variety of traditional test and measurement and ATE applications. The VXI standard uses a mainframe chassis with a plurality of slots to hold modular instruments on plug-in boards. The VXI architecture is capable of interfacing with both message-based instruments and register-based instruments. A message-based instrument is an instrument which is controlled by a string of ASCII characters, whereas a register-based instrument is controlled by writing a bit stream of 1's and 0's directly to registers in the instrument hardware.

Another approach taken for instrumentation needs is based on the PCI (Peripheral Component Interconnect) bus standard. PCI bus instruments and PXI (PCI extensions for Instrumentation) instruments leverage off of the PCI bus found in mainstream computer systems. These instruments include a connector which is electrically compatible with the PCI bus. "Desktop PCI" instruments have a conventional PCI form factor for use in desktop PCs. The PXI instrumentation bus standard, promulgated by National Instruments, includes a CompactPCI mechanical form factor, is electrically compatible with the PCI bus, and includes extra signal definitions for instrumentation purposes. For example, many instrumentation applications require system timing capabilities that cannot be directly implemented across standard desktop computer backplanes such as ISA, PCI, or PCMCIA. PXI leverages the electrical features defined by the widely adopted PCI specification by using the standard PCI bus and adding specific signals for instrumentation including bused trigger lines, slot-specific triggers, a dedicated system clock, and slot-to-slot local buses to address the need for advanced timing, synchronization, and side-band communication. In addition to eight PXI bused trigger lines which allow triggers to be passed from module to module, PXI includes a star trigger bus which offers ultra-high performance synchronization features. The star trigger bus implements a dedicated trigger line between the first peripheral slot (adjacent to the system slot) and the other peripheral slots. A star trigger controller can be installed in this slot and can be used to provide very precise trigger signals to other peripheral modules. Thus, the PXI specification adds electrical features that meet the high-performance requirements of instrumentation applications by providing triggering, local buses, and system clock capabilities.

As noted above, PXI leverages the CompactPCI form factor, which combines the PCI electrical specification with rugged Eurocard mechanical packaging and high-performance connectors. This combination allows CompactPCI and PXI systems to have up to seven peripheral slots versus four in a desktop PCI system. Systems with more expansion slots can be built by using multiple bus segments with industry-standard PCI-PCI bridges. For example, a 13-slot PXI system can be built using a single PCI-PCI bridge. PXI also offers two-way interoperability with CompactPCI products.

By implementing desktop PCI in a rugged form factor, PXI systems can leverage the large base of existing industry-standard software. Desktop PC users have access to different levels of software, from operating systems to low-level device drivers to high-level instrument drivers to complete graphical APIs. All of these software levels can be used in PXI systems. PXI defines software frameworks (for Microsoft Windows 95, Windows 98, Windows NT, and Windows 2000) for complete systems and requires appropriate device driver software for all PXI peripheral modules to ease system integration. Furthermore, PXI implements the Virtual Instrument Software Architecture (VISA). VISA is used to locate and communicate with serial, VXI, and GPIB peripheral modules. PXI extends VISA beyond these interfaces to allow for the location and control of PXI peripheral modules. This extension preserves the model for instrumentation software that has been adopted by the instrumentation community. The result is a very powerful software commonality that spans PXI, CompactPCI, desktop PCI, VXI, GPIB, and other instrumentation architectures.

However, current instrumentation bus standards such as VXI and PXI may not fully leverage the latest bus technologies. One proposed bus design utilizes a channel based, switched fabric bus architecture for improved performance. One example of a channel based, switched fabric bus is the InfiniBand bus. Although these new bus designs, such as InfiniBand, may provide improved technologies for connecting servers and devices, such as remote storage, networking devices, and other servers, as well as for use inside servers for inter-processor communication (IPC) in parallel clusters, the designs are not adequate for instrumentation purposes.

Therefore, improved systems are desired for extending channel-based switched fabric architectures to accommodate instrumentation systems and functionality.

SUMMARY

The present invention comprises various embodiments of a system which extends channel-based switched fabric architectures to accommodate instrumentation systems and functionality. In one embodiment, the instrumentation system may comprise a chassis which may include a plurality of slots, each of which may be operable to receive an inserted module. The chassis may also include a backplane which may be operable to provide for communication among the inserted modules. The backplane may include a switched fabric bus and a plurality of instrumentation lines which provide instrumentation signaling functions. In one embodiment, the switched fabric bus may be a channel based switched fabric bus, such as the InfiniBand bus. In one embodiment, the switched fabric bus may include one or more routers and/or switches which may be operable to selectively provide for communication between the inserted modules. The chassis may further include a plurality of interface connectors coupled to the backplane which may be operable to connect to respective inserted modules.

In one embodiment, the plurality of instrumentation signaling lines may include at least one local bus which may provide for adjacent slot communication of analog signals and/or digital signals. The local bus may be operable to connect each of at least a subset of the plurality of slots with its adjacent slots to provide a communication path between the inserted modules for one or more of analog signals or side-band digital communications.

In one embodiment, the plurality of instrumentation signaling lines may include one or more reference clock lines for transmitting one or more fixed or variable frequency system reference clock signals which may be operable to provide synchronization signals for the inserted modules. In one embodiment, the reference clock signals may be generated by a reference clock (or multiple reference clocks) comprised on one or more of the backplane, one of the inserted modules, or an external system which may be coupled to one of the inserted modules. In one embodiment, the reference clock may comprise a differential clock, where the clock signal is determined by the difference of two signals transmitted on two signal lines, respectively.

In one embodiment, the plurality of instrumentation signaling lines may include a trigger bus which may include a plurality of trigger lines. Each of the plurality of trigger lines may be operable to connect a corresponding slot to the trigger bus. In one embodiment, one or more of the trigger lines may be designed for open-collector signaling. The trigger bus may be operable to communicate trigger signals between the inserted modules for synchronizing operations between the modules.

In one embodiment, the system chassis may include a star trigger controller slot which may be operable to receive an inserted star trigger controller module. The plurality of instrumentation signaling lines may include a star trigger bus which may include a plurality of dedicated trigger lines, each connecting the star trigger controller slot to one of the plurality of instrumentation slots. The star trigger bus may be operable to communicate precision trigger signals generated by the inserted star trigger controller module to the inserted modules in each of the plurality of slots. In one embodiment, each of the dedicated trigger lines may be of equal length to provide matched propagation times of the trigger signals. In one embodiment, one or more of the dedicated trigger lines may be designed for differential signaling.

In one embodiment, the plurality of instrumentation signaling lines may include one or more of, two or more of, three or more of, or all of a local bus, system reference clock signal lines, a trigger bus, and a star trigger bus.

In one embodiment, the plurality of instrumentation signaling lines may further include a high voltage analog bus and/or a low voltage analog bus. The analog bus may be operable to provide for analog communications between inserted modules. In another embodiment, the analog bus may be operable to transmit power between modules.

In one embodiment, the instrumentation system may include one or more instrumentation modules each of which may be operable to be inserted into a respective one of the plurality of slots, and wherein the backplane may be operable to logically couple to each of the one or more instrumentation modules when inserted into the slots. Each of the one or more instrumentation modules may be operable to perform instrumentation functions in the instrumentation system.

In one embodiment, the instrumentation system may include a system controller slot which may be operable to receive an inserted system controller module, wherein the inserted system controller module may be operable to provide system controller functions in the instrumentation system. In one embodiment, the system controller module may comprise a computer module which may be operable to provide computer functions in the instrumentation system. In another embodiment, the system controller module may comprise an interface for coupling to an external system, such as a computer system.

Thus, various embodiments of the systems described above may provide extended instrumentation and control functions which leverage the enhanced functionality and performance of switched fabric bused systems, such as systems based on the InfiniBand standard.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
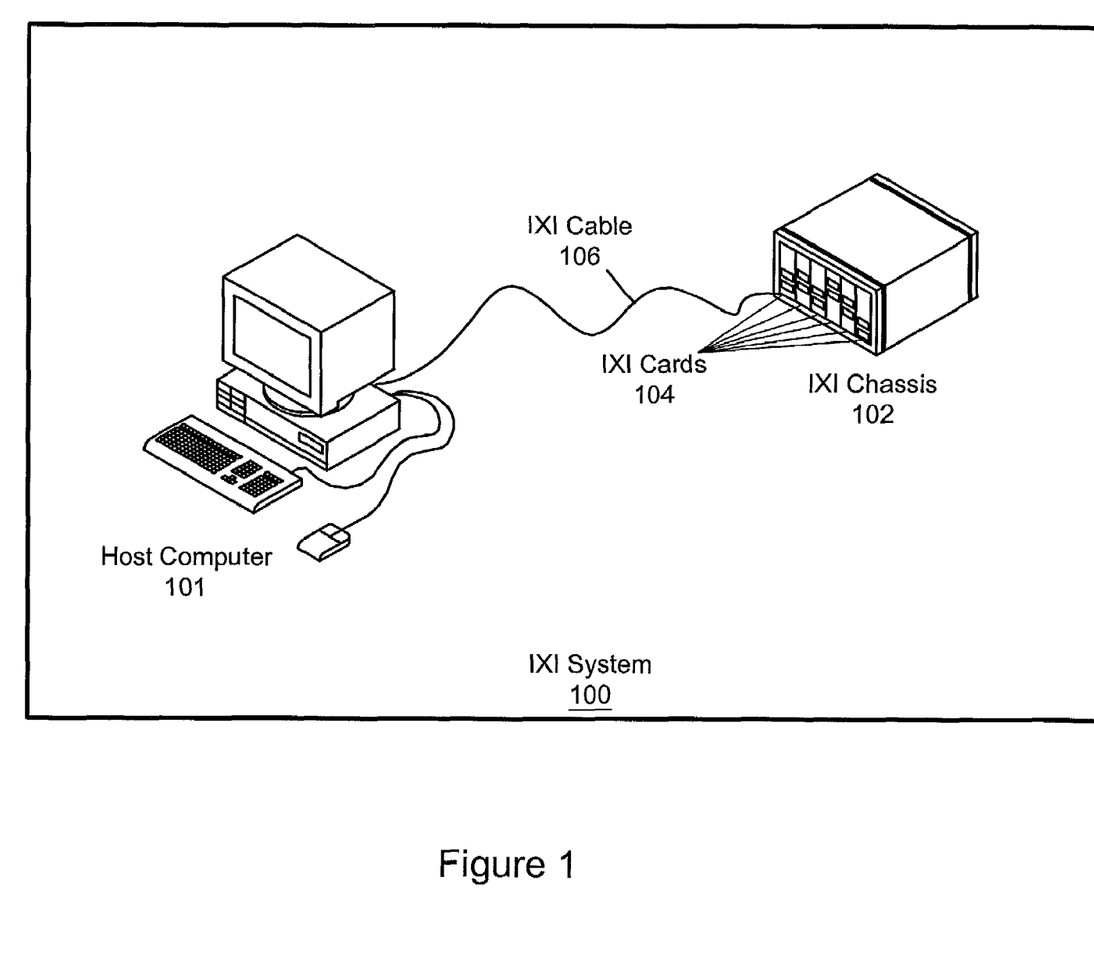
FIG. 1 illustrates an InfiniBand Extensions for Instrumentation (IXI) system including a host computer, according to one embodiment.

FIG. 1: An IXI System

FIG. 1 illustrates one embodiment of an instrumentation system comprising a host computer 101 coupled to a chassis 102. The chassis 102 includes a backplane having a switched fabric bus and instrumentation signaling lines. In the present invention, the switched fabric bus is the InfiniBand bus, and the system may be referred to as InfiniBand Extensions for Instrumentation (IXI) system. Although various embodiments of the invention are shown herein as being based on the InfiniBand standard, this is for illustration purposes only and is not intended to limit the invention to that particular standard, i.e., the invention may be implemented with any switched fabric system. Other switched fabric buses may also be used in embodiments of the invention, such as Rapid 10, developed by Motorola, Inc. and Tundra Semiconductor Corporation, or StarFabric, developed by StarGen, Inc.

InfiniBand Description

InfiniBand is a standard based on switched serial links to device groups and devices and may be used to create high-speed system clusters and storage area networks (SANs), both of which require fast communications between nodes in a system and a reliable infrastructure for transmitting data. InfiniBand is characterized by redundancy across a system, reliability in data transfers, serviceability while in live operation, and scalability at affordable costs.

In an InfiniBand based system, a host channel adapter (HCA) is implemented within each server or workstation serving as a host system, while a target channel adapter (TCA) is deployed in the devices or device groups. These are connected with serial links either directly or through a switch. Devices on an InfiniBand network may be connected through switches and routers to several hosts. Each switch operates a specific subnetwork of directly attached devices, while a router interconnects several switches. All InfiniBand devices are thus connected in a fabric, providing point-to-point communication between attached devices.

InfiniBand uses the next-generation Internet Protocol, IPv6, rather than the SNA mainframe networking protocol. IPv6 brings particular advantages to the InfiniBand fabric by providing a well-documented method of address assignment, along with auto-configuration and routing and security mechanisms. This gives a 128-bit address space for each end-node, which is more than sufficient to support all the devices in the world.

A single InfiniBand link operates at 2.5 Gigabits per second (Gbps), point-to-point in a single direction. Bidirectional links offer twice the throughput and can be aggregated together into larger pipes of 1.25 Gigabytes per second (four conjoined links), or 3.75 Gigabytes per second (12 links). Higher aggregations of links will be possible in the future.

InfiniBand provides for packet- or connection-based communication, allowing for its use with devices that transfer blocks of data and continuous data streams. The basic unit of communication is a message. A message may be a remote direct memory access (RDMA) read or write operation, a channel send or receive message, an atomic operation, or a multicast operation. An RDMA operation is a direct exchange of data between the memory contents of two devices over a network. A channel operation sends connection-oriented set-up and control information, while an atomic operation is transaction-based and can be undone if necessary. A multicast operation creates and controls multicast groups.

Messages are sent within packets, many of which can be combined to make up a single message. While messages function at the operating system level, packets function at the network level. The data transfer protocol level supports six communications protocols: reliable and unreliable connections, reliable and unreliable datagrams, multicast connections, and raw packets. The last two are optional for implementation within devices. In this context, the word reliable implies that the hardware maintains a sequence number for each packet, generates acknowledgment messages that are sent back to the source for each packet received, rejects duplicate packets, notifies the source of missing packets for redelivery, and provides recovery facilities for failures in the fabric.

Each end-node has a globally unique identifier (GUID) for management purposes. Each channel adapter connected to the end-node has a GUID that is separate from the global identifier (GID). Thus, a server may have several HCAs for redundancy or connection to different fabrics, each with its own GID. Furthermore, each channel adapter may have several ports with its own local identifiers (LIDs) which are unique to its subnet and switch. From a network point of view, the GID is a unique 128-bit IPv6 address, and the LID is a TCP or UDP port at that address.

Each link between an HCA and TCA is subdivided into a series of virtual lanes in order to provide flow control for communications. Within each virtual lane the flow of packets can have differentiated priorities and services that are maintained across the link. While there can be up to 16 virtual lanes per link, there needs to be at least one for the data stream and one for the fabric management packets. With different virtual lanes, the communications between groups of devices can be separated to prevent them from directly interfering with each other's data transfers. For example, a 300 MB/s link could have 15 separate virtual lanes of 20 MB/s each going between 15 different pairs of devices—none of which interrupt the bandwidth going across other lanes.

Quality of services (QoS) can be defined between an HCA and a TCA (based upon these virtual lanes), as well as a queue pair (QP). Each end of the link has a queue of messages to be delivered to the other, and different service levels may be assigned for each QP as needed for a particular application. For example, a multimedia video stream may need a service level that offers a continuous flow of time-synchronized messages.

InfiniBand provides a scalable solution to the ever-increasing bandwidth demands of server systems. The bandwidth capacities of InfiniBand are sufficient for some of the fastest communications technologies. More importantly, this bandwidth can be scaled by adding additional links between the devices, without resorting to a significantly more expensive solution or radically different implementation.

The InfiniBand standard is intended to both expand and simplify connectivity between devices. By creating a high-bandwidth protocol with reliable QoS, a wide variety of hardware may be connected over the same serial link. At the same time, a relatively tiny connector to each host computer can quickly connect it to any number of devices. By offering direct RDMA operations between devices, InfiniBand opens up a new level of serverless communications between devices. Thus, for example, storage devices do not need a host to directly control a backup session to a tape library.

By supporting both packet and connection protocol mechanisms, devices that previously required separate protocols and hardware connections may be supported. Additionally, rather than using a separate port for incoming video, a video source may be attached to an InfiniBand switch and accessed over the network. InfiniBand uses the IPv6 protocol for the exact purpose it was designed: to connect numerous network devices. Devices can communicate with each other directly over the Internet, without the need for a high-level operating system at every turn.

An IXI System

The InfiniBand standard may be extended to provide and facilitate instrumentation services and functions. This extended standard may be referred to as InfiniBand eXtensions for Instrumentation (IXI). IXI may facilitate computer based instrumentation operations while leveraging the enhanced network communications capabilities of a switched fabric system. In a similar manner, other switched fabric buses may be extended to provide and facilitate instrumentation services and functions.

As FIG. 1 shows, in one embodiment, IXI instrumentation system 100 may comprise a host computer system 101 which may be coupled to an IXI chassis 102 via an IXI cable 106. In one embodiment, the IXI system may include one or more IXI instrumentation modules or cards 104 which may be operable to be inserted into the IXI chassis 102 and which may be operable to provide instrumentation services or functions, such as oscilloscope functions, multi-meter functions, spectrum analyzer functions, etc., or any other instrumentation function or service. In one embodiment, the host computer 101 may be operable to execute one or more applications to coordinate and direct instrumentation operations performed by the IXI modules 104 in the IXI chassis 102. As shown, the IXI chassis 102 may include a plurality of slots which may be operable to receive the inserted IXI modules 104. The IXI modules 104 may then communicate with one another and with external systems through a switched fabric bus which may be comprised in the IXI chassis 102. In one embodiment, one of the instrumentation modules 104 may provide an interface port for coupling to the host computer 101. Further details of the IXI chassis 102 and switched fabric bus are provided below with reference to FIGS. 4–7.

In one embodiment, the IXI system 100 may be used as a measurement system, and so may also include transducers, sensors, actuators or other detecting (or generating) means for measuring or providing "field" electrical signals which represent a process, physical phenomena, equipment being monitored or measured, etc. The IXI modules 104 may be coupled to the transducers and may comprise measurement hardware which may be operable to receive raw measurement signals from the transducers, and to process the signals into a form suitable for analysis or display. As mentioned above, the measurement hardware 104 may be configured and controlled by measurement software executed by the host computer system 101. In another embodiment, the IXI system 100 may be used as an automation system or control system, or as a simulation system.

Figure 2:
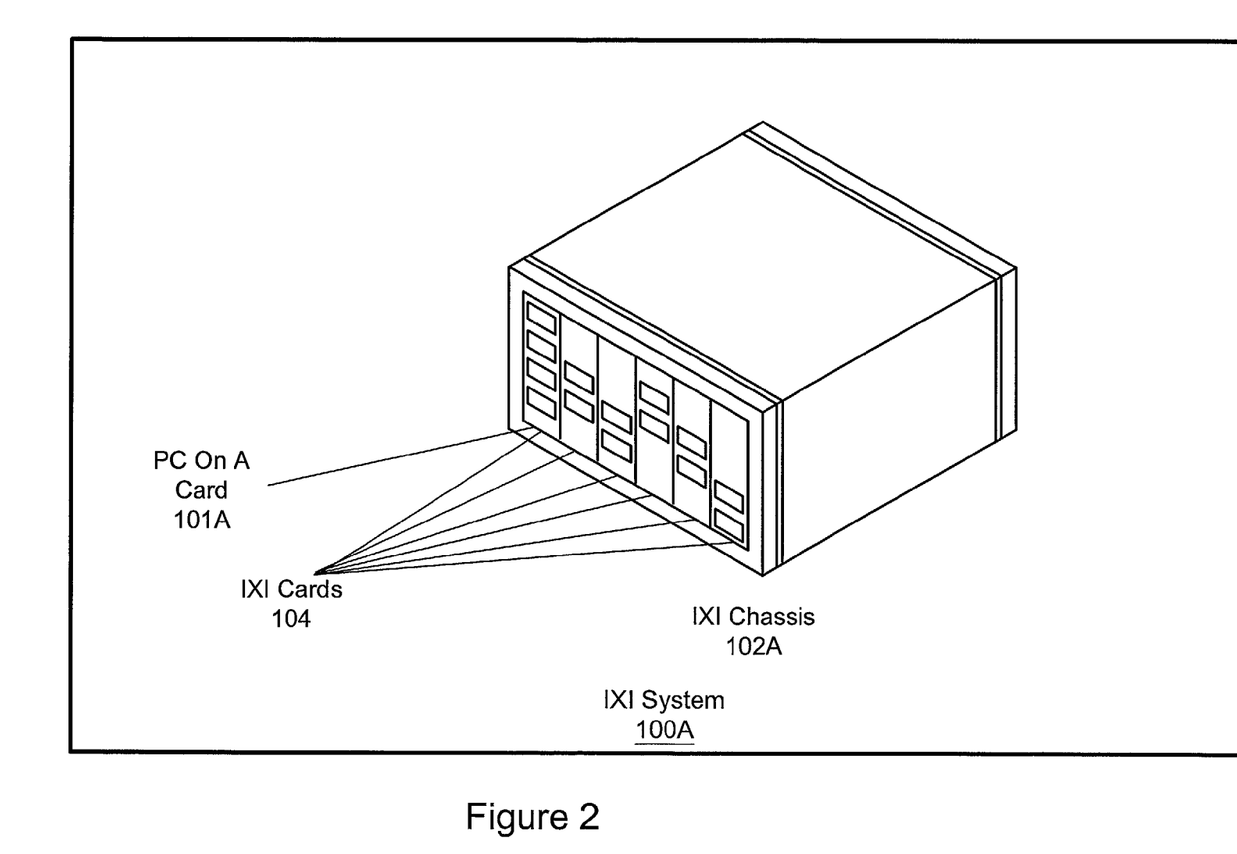
FIG. 2 illustrates an IXI system with an on-board computer, according to one embodiment.

FIG. 2: An IXI System With On-Board Computer

FIG. 2 illustrates one embodiment of an IXI system which may include a host computer on an IXI module 10A, referred to as a "PC on a card", as well as IXI instrumentation modules 104. As FIG. 2 shows, the host computer 101A and the IXI instrumentation modules 104 may be comprised in the IXI chassis 102A. All of the host computer functions described above with reference to FIG. 1 may be performed by the computer module 101A, thus providing an integrated instrumentation system 100A with a small form factor which may be suitable for portable instrumentation tasks, such as for use in the field or in environments where space is limited. The use of host computer module 101A may also simplify cabling requirements for the system 100A, thus reducing cost and maintenance requirements.

Figure 3:
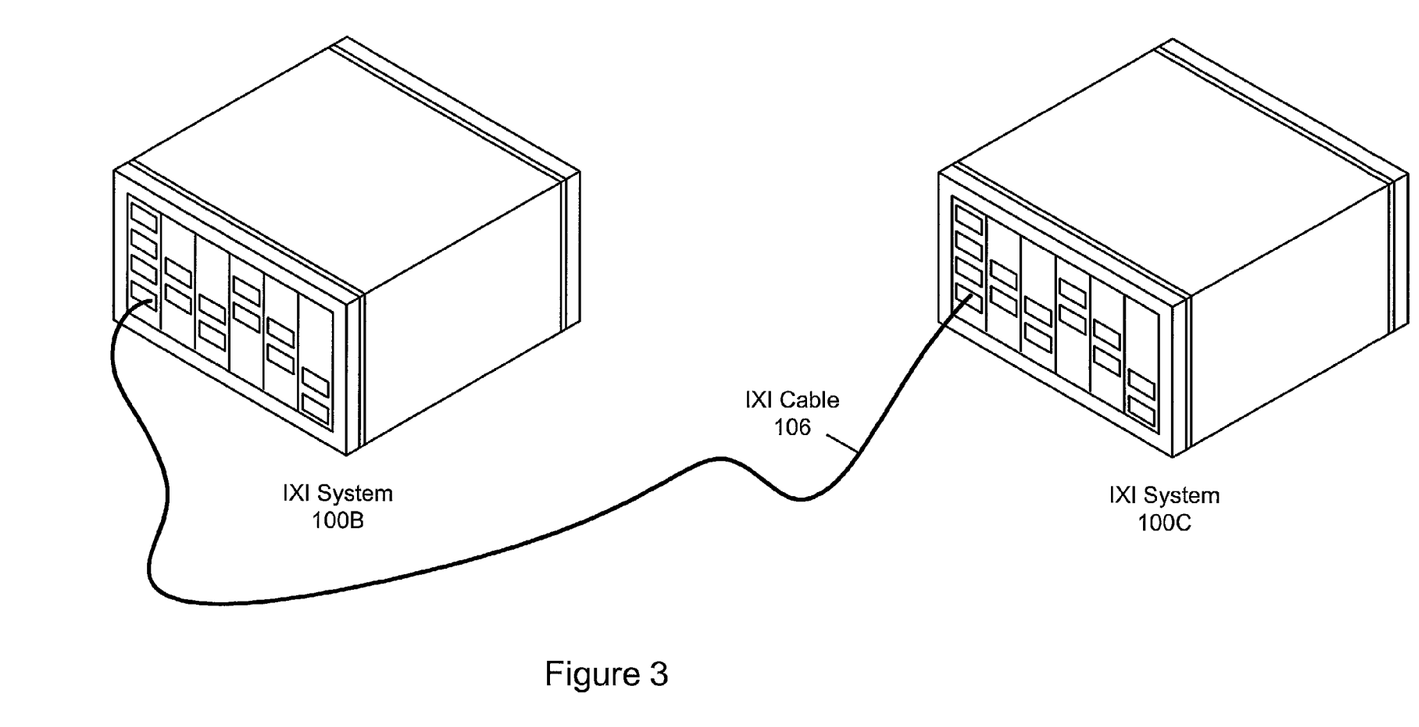
FIG. 3 illustrates two networked IXI systems.

FIG. 3: Networked IXI System

FIG. 3 illustrates a networked IXI system, according to one embodiment. As FIG. 3 shows, IXI system 100B may be coupled to IXI system 100C via IXI cable 106. In one embodiment, each IXI system 100 may include a host computer module 101A, described above with reference to FIG. 2. In another embodiment, only one of the IXI systems 100 may include a host computer module 101A which may provide host computer functions to the instrumentation modules 104 on both IXI systems 100. In one embodiment, each IXI system 100 may include a module 104, for example, computer module 101A, which may provide an interface port for coupling to the other system 100, or to other external systems. In one embodiment, a plurality of IXI systems 100 may be daisy-chained together with transmission cables 106.

In one embodiment, a plurality of IXI systems 100 may be coupled to a network, such as the Internet, and may communicate with each other through the network. In another embodiment, one or more IXI systems 100 may be coupled to external systems or devices over the network, such as transducers, machine vision systems, control systems, monitors, or other instrumentation or measurement devices, and may thus comprise remote distributed instrumentation or measurement systems.

In various embodiments, IXI systems 100 may include instrumentation modules 104 which may be operable to provide instrumentation functions and services such as data acquisition, distributed I/O, such as National Instrument's Fieldpoint™ distributed I/O system, vision/motion control, computer-based instruments such as oscilloscopes, multimeters, spectrum analyzers, PLC (programmable logic controllers), and other instrumentation or automation services or devices.

In one embodiment, instrumentation signals, e.g., clock signals, trigger signals, etc., may be transmitted across one or more of the networked IXI systems 100. For example, in reference to FIG. 3, instrumentation signals originating in IXI system (chassis) 100B or in an external system coupled to IXI system 110B, may be propagated through the IXI cable 106 to IXI system 100C. Thus, the modules 104 of the IXI system 110C may respond to instrumentation signals from IXI system 110B as though the two IXI systems were one IXI system. Furthermore, in an embodiment where multiple systems 110 are daisy-chained together (or coupled via a network, such as the Internet), instrumentation signals from any of the systems may be transmitted to the rest of the systems.

Figure 4:
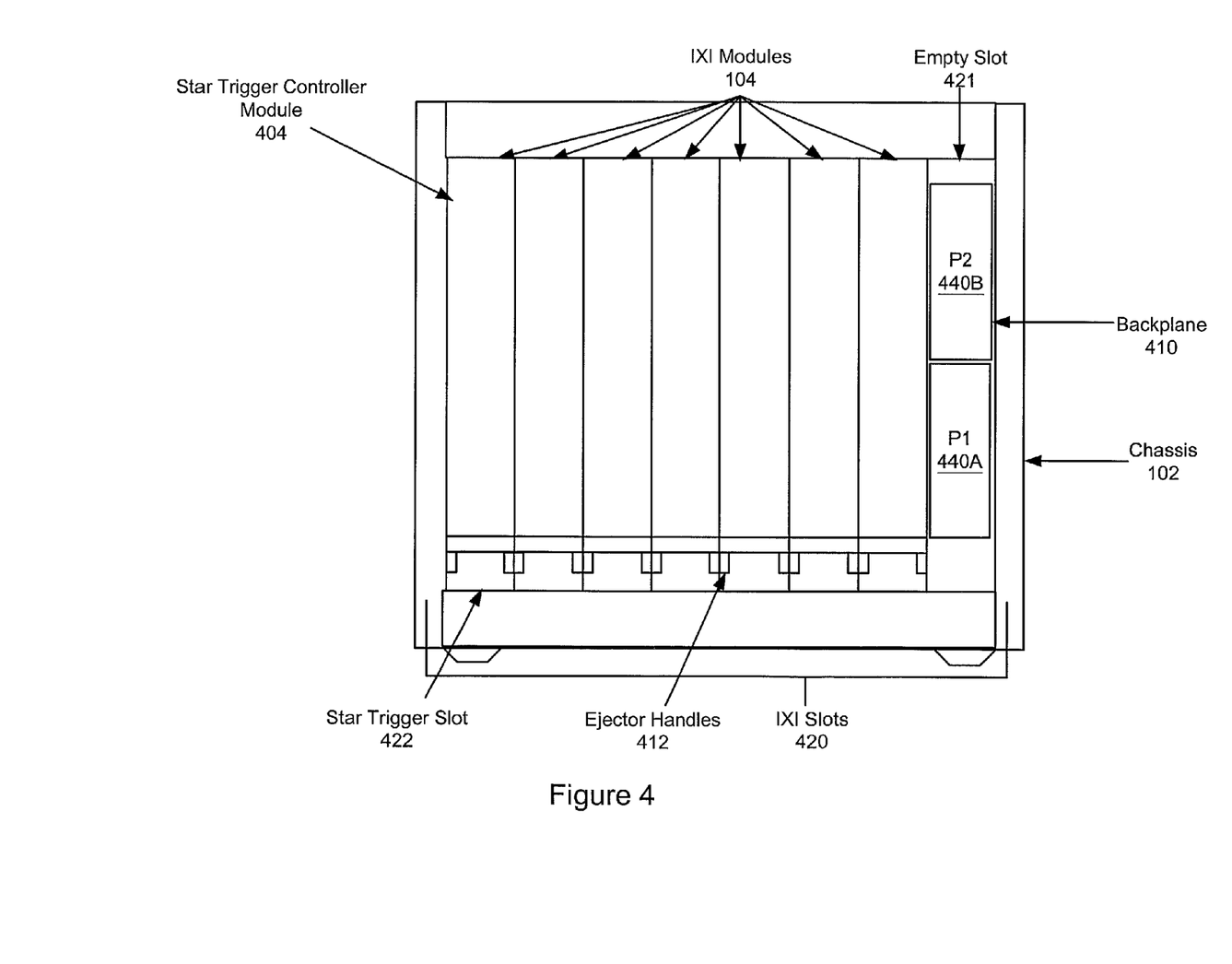
FIG. 4 is block diagram of an IXI system, according to one embodiment.

FIG. 4: Block Diagram Of IXI System FIG. 4 is a block diagram of an IXI system 100, according to one embodiment. As FIG. 4 shows, in one embodiment, IXI chassis 102 may include a plurality of instrumentation slots 420, each of which may be operable to receive an inserted IXI module 104. In one embodiment, each slot 420 may include an ejector handle 412 which may be operable to facilitate the removal of a module 104 from the slot 420. In another embodiment, the ejector handles 412 may be comprised on each module 104 instead.

In one embodiment, the chassis 102 may also include a backplane 410 located at the rear of the chassis 102 which may provide for communication among the inserted modules 104. In one embodiment, the backplane 410 may include a switched fabric bus which may be operable to selectively provide for communication between the inserted modules 104. The backplane 410 may also include instrumentation signaling lines to support instrumentation services and functions. In one embodiment, the backplane 410 may be coupled to one or more interface connectors 440, such as P1 440A and P2 440B, as shown in FIG. 4. Note that in the diagram, the interface connectors 440 in slot 421 are visible because slot 421 is empty, otherwise, the connectors 440 would be obscured by the inserted module. It should be noted that in some definitions, the connectors 440 may be considered part of the backplane 410 itself. Each connector 440 may be operable to electrically or optically connect to an inserted module 104, thereby coupling the inserted module 104 to the backplane 410. In one embodiment, at least one of the interface connectors 440, such as interface connector 440A, may comprise an InfiniBand Bus interface connector, and may be operable to couple an inserted module 104 to an InfiniBand bus comprised on the backplane 410. In one embodiment, at least one of the interface connectors 440, such as interface connector 440B, may comprise an instrumentation signaling line connector which may be operable to couple an inserted module 104 to the instrumentation signaling lines comprised on the backplane 410. More details of the switched fabric bus and instrument signaling lines are presented below with reference to FIG. 5.

As FIG. 4 shows, in one embodiment, one of the IXI slots 420 may comprise a star trigger slot 422 which may be operable to receive an inserted star trigger controller module 404, described in more detail below with reference to FIG. 7.

Figure 5:
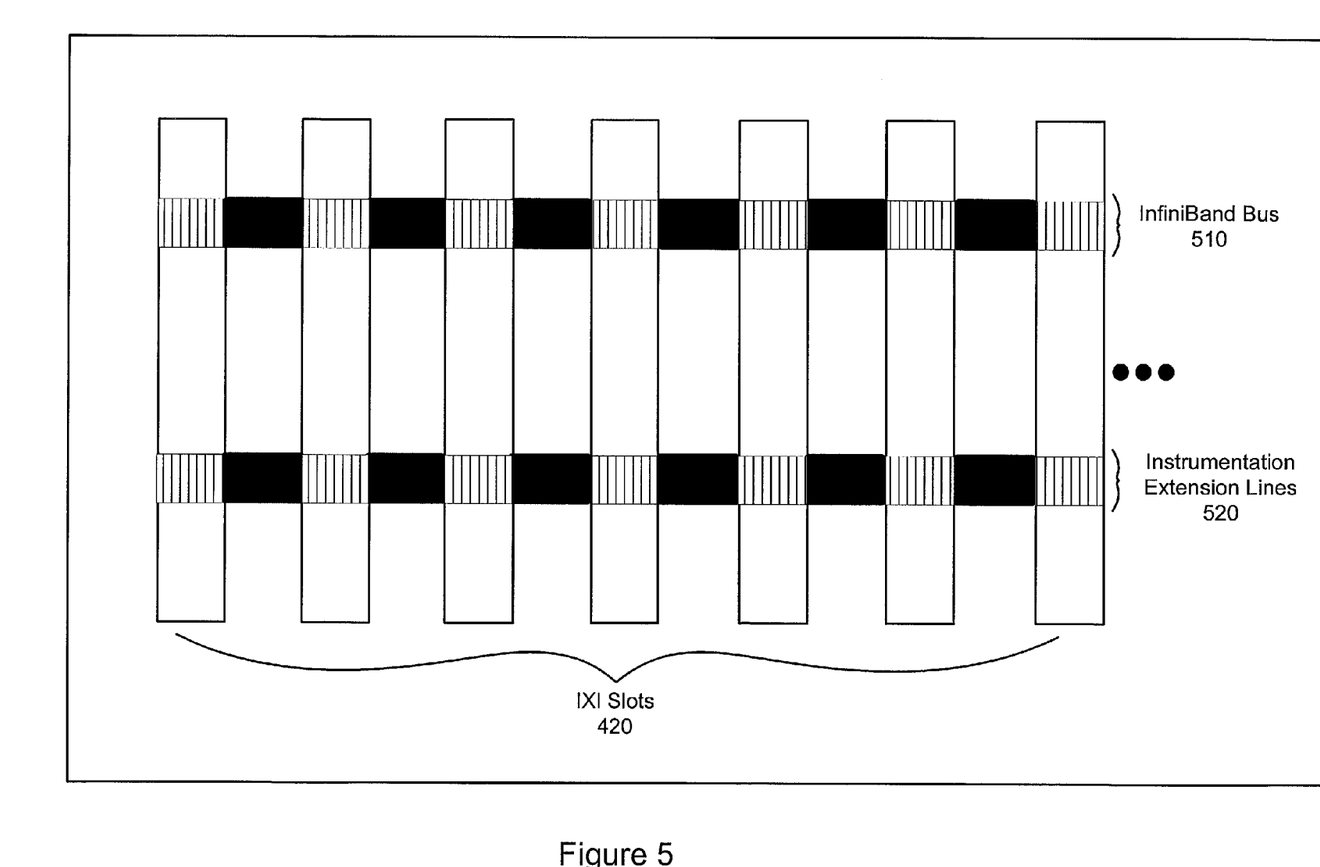
FIG. 5 is a block diagram of an IXI system with instrumentation signaling lines, according to one embodiment.

FIG. 5: Block Diagram of IXI System With Switched Fabric Bus and Instrumentation Signaling Lines FIG. 5 is a block diagram of an IXI system 100 with a switched fabric bus and instrumentation signaling lines on the system backplane 410, according to one embodiment. As FIG. 5 shows, in one embodiment each of the plurality of instrumentation slots 420 may allow a corresponding inserted module 104 to couple to the switched fabric bus 510 and the instrumentation signaling lines 520 on the backplane 410.

The inserted module 104 couples to the switched fabric bus 510 through interface connector 440A, described above with reference to FIG. 4. In one embodiment, the switched fabric bus 510 may be a channel-based switched fabric bus, such as an InfiniBand bus, described above with reference to FIG. 1. In one embodiment, the switched fabric bus may include one or more routers and/or switches which may be operable to selectively provide communication paths between the inserted modules 104. The flexibility of the InfiniBand protocol may allow any of the slots 420 to be used as a system controller slot, i.e., a system controller module, such as computer module 101A, may be inserted into any of the available module slots 420, and the InfiniBand bus 510 may facilitate communications between it and the other modules 104. Additionally, use of the InfiniBand protocol may allow virtually any number of slots 420 and corresponding modules 104 to be included in the IXI system 100, i.e., the number of slots/modules may be limited primarily by the size and physical design of the chassis 102.

As noted above, a plurality of instrumentation signaling lines 520 may also be included on the IXI system backplane

410. Each of the plurality of instrumentation slots 420 may allow a corresponding inserted module 104 to couple to the instrumentation signaling lines 520, such as through interface connector 440B, described above with reference to FIG. 4. The instrumentation signaling lines 520 may provide an extra set of communication lines on the backplane 410 for instrumentation signaling functions, such as a local bus, a trigger bus, one or more reference clocks, and a star trigger bus, described below with reference to FIGS. 6 and 7. The plurality of instrumentation signaling lines may further include a high voltage analog bus and/or a low voltage analog bus.

Figure 6:
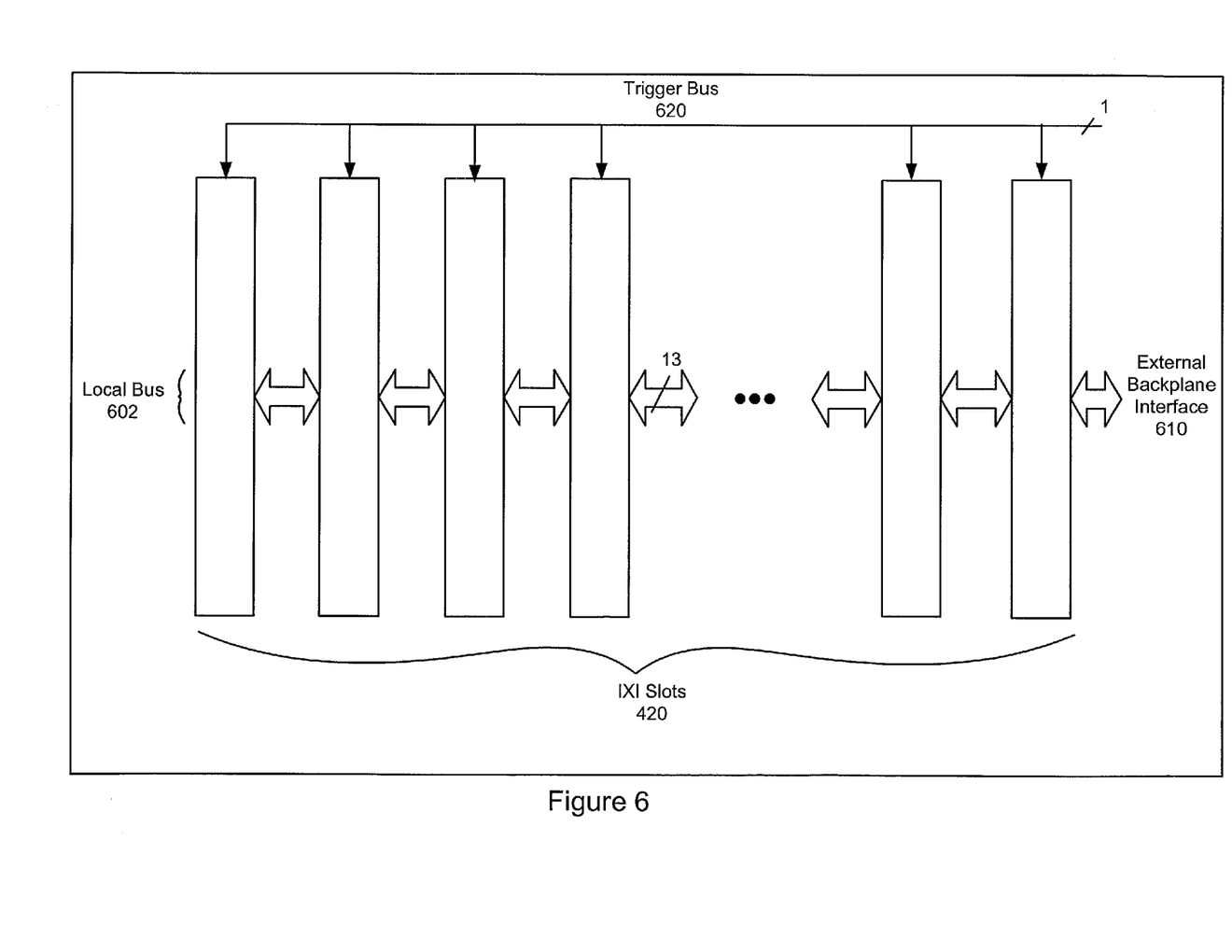
FIG. 6 is a block diagram of an IXI system with a local bus and a trigger bus, according to one embodiment.

FIG. 6: Block Diagram of IXI System With Local Bus and Trigger Bus

FIG. 6 is a block diagram of an IXI system 100 where at least a subset of the instrumentation signaling lines 520 have been defined to include a local bus and a trigger bus.

As FIG. 6 shows, in one embodiment, a local bus 602 may be comprised on the system backplane 410 to provide a communication path for adjacent slot or module communication. In one embodiment, the local bus 602 may be operable to facilitate communication of analog signals and digital signals, such as side-band digital communication signals between adjacent slots 420 or modules 104. It should be noted that the side-band digital communication does not affect the IXI (InfiniBand bus) data bandwidth. In one embodiment, at least a subset of the slots 420 or modules 104 may define the use of the local bus 602, i.e., the functions of the local bus 602 may be user-defined. In one embodiment, the local bus 602 may comprise 13 parallel communication lines.

As indicated in FIG. 6, in one embodiment, a trigger bus 620 may be included on the IXI system backplane 410 for inter-module synchronization and communication. In one embodiment, the trigger bus 620 may include a plurality of trigger lines which couple corresponding slots 420 or inserted modules 104 to the trigger bus 620. The trigger bus 620 may be operable to communicate trigger signals between the inserted modules 104. For example, trigger signals may be transmitted over the trigger bus 620 to synchronize the operation of several different IXI instrumentation modules 104. In one embodiment, trigger signals may be passed from one module 104 to another module 104 over the trigger bus 620, allowing precisely timed responses to asynchronous external events being monitored or controlled. In one embodiment, one or more of the trigger bus signals 620 may be designated for open-collector signaling. In other words, the trigger bus signal may be initiated by one or more trigger sources without the possibility of contention. In one embodiment, the trigger bus 620 lines may also be used to transmit alternate clock signals to selected modules, i.e., signals from an auxiliary clock which differs from a primary system reference clock, described below with reference to FIG. 7.

Figure 7:
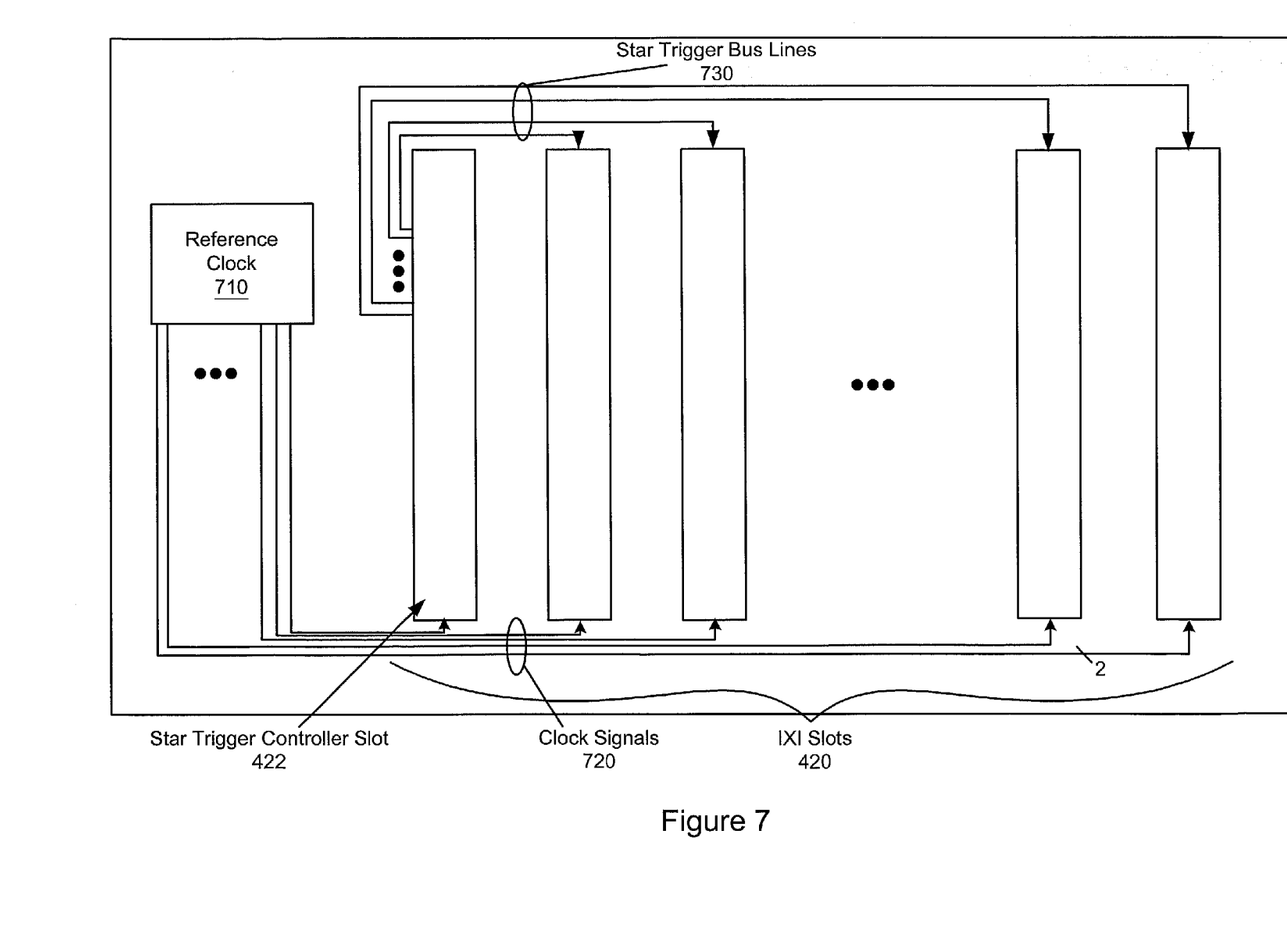
FIG. 7 is a block diagram of an IXI system with a star trigger bus and reference clock lines, according to one embodiment.

FIG. 7: Block Diagram of IXI System With Reference Clock and Star Trigger Bus FIG. 7 is a block diagram of an IXI system 100 where at least a subset of the instrumentation signaling lines 520 have been defined to include reference clock signal lines and a star trigger bus.

As FIG. 7 shows, each of the plurality of instrumentation slots 420 may be coupled to one or more reference clocks 710 by one or more reference clock signal lines 720. In this example, only one reference clock 710 is shown, although in other embodiments, two or more reference clocks may be used. The reference clock lines may be operable to transmit reference clock signals generated by the reference clock 710 to each of the instrumentation slots 420, thereby providing synchronization signals to the corresponding instrumentation modules 104 inserted in the slots 420. In one embodiment the reference clock 710 may be comprised on the IXI system backplane 410. In another embodiment, the reference clock 710 may be comprised on an inserted instrumentation module 104, such as a system controller module. In yet another embodiment, the reference clock 710 may be comprised on an external system coupled to the IXI system 100, wherein the reference clock signals are transmitted to the IXI system 100 via an IXI cable 106. In an embodiment where multiple reference clocks are used, various of the clocks may be comprised on any of the backplane 410, on one or more inserted instrumentation modules 104, and/or on an external system coupled to the IXI system 100. In one embodiment, the reference clock 710 may be a differential reference clock, wherein two reference clock lines 720 are provided to each slot 420 for transmission of a differential clock signal. In one embodiment reference clock 710 may of be a fixed frequency. In another embodiment the reference clock 710 may be of a configurable or variable frequency, e.g., may be set by the user.

In one embodiment, the IXI system may include a star trigger controller slot 422 which may be operable to receive star trigger controller module 404, referenced in FIG. 4. A star trigger bus 730 may include a plurality of dedicated star trigger bus lines 730 comprised on the IXI system backplane 410 which couple the star trigger controller slot 422 to each of the other instrumentation slots 420. The star trigger controller 404 may be operable to provide precision trigger signals over the star trigger bus lines 730 to synchronize operations of the instrumentation modules 104. In one embodiment, each of the dedicated trigger lines may be of equal length to provide matched propagation times of the trigger signals. In another embodiment, the star trigger bus 730 may include differential trigger lines, in which the trigger signal is determined from the difference in signals on two star trigger lines. In one embodiment, the star trigger controller slot 422 may be operable to receive an inserted standard instrumentation module 104 when star trigger functionality is not needed.

In one embodiment, the plurality of instrumentation signaling lines 520 may be defined to include one or more of a local bus 602, reference clock signal lines 720, a trigger bus 620, and a star trigger bus 730. In one embodiment, the plurality of instrumentation signaling lines 520 may be defined to include two or more of a local bus 602, reference clock signal lines 720, a trigger bus 620, and a star trigger bus 730. In one embodiment, the plurality of instrumentation signaling lines 520 may be defined to include three or more of a local bus 602, reference clock signal lines 720, a trigger bus 620, and a star trigger bus 730. In addition, as noted above, the plurality of instrumentation signaling lines may further include a high voltage analog bus and/or a low voltage analog bus.

In one embodiment, the IXI system 100 may include a dedicated system controller slot which may be operable to receive an inserted system controller module with a special form factor, i.e., the system controller slot may be designed to accommodate the special form factor of the module. For example, the system controller module may require a slot to be wider than the standard instrumentation slot 420.

Various embodiments of the systems described above may provide extended instrumentation and control functions which leverage the enhanced functionality and performance of switched fabric bused systems, such as systems based on the InfiniBand standard.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

We claim:

1. An instrumentation system, comprising:
   a chassis, comprising:
      a plurality of slots, wherein each of the plurality of slots is operable to receive an inserted module;
      a backplane, comprising:
         a switched fabric bus; and
         a plurality of instrumentation signaling lines which provide instrumentation signaling functions; and
         a plurality of interface connectors coupled to the switched fabric bus and to the plurality of lines in the backplane, wherein each of the connectors is operable to connect to a respective inserted module;
      wherein the backplane is operable to provide for communication among the inserted modules.

2. The instrumentation system of claim 1, wherein the switched fabric bus is a channel based switched fabric bus.

3. The instrumentation system of claim 2, wherein the channel based switched fabric bus is the InfiniBand bus.

4. The instrumentation system of claim 1, wherein the switched fabric bus includes one or more routers and/or switches which are operable to selectively provide for communication between the inserted modules.

5. The instrumentation system of claim 1, wherein the plurality of instrumentation signaling lines include:
   at least one local bus, wherein the at least one local bus provides for adjacent slot communication for one or more of analog signals or digital signals.

6. The instrumentation system of claim 5, wherein the at least one local bus is operable to connect each of at least a subset of the plurality of slots with its adjacent slots, wherein the at least one local bus is operable to provide a communication path between the inserted modules for one or more of analog signals or side-band digital communications.

7. The instrumentation system of claim 1, wherein the plurality of instrumentation signaling lines include:
   one or more lines for transmitting one or more system reference clock signals, wherein the one or more system reference clock signals are operable to provide synchronization signals for the inserted modules.

8. The instrumentation system of claim 7, wherein the reference clock signals are generated by a reference clock comprised on one or more of the backplane, one of the inserted modules, or an external system which is coupled to one of the inserted modules.

9. The instrumentation system of claim 8, wherein the reference clock comprises a differential clock.

10. The instrumentation system of claim 8, wherein the reference clock comprises a fixed frequency reference clock.

11. The instrumentation system of claim 8, wherein the reference clock comprises a variable frequency reference clock.

12. The instrumentation system of claim 7, wherein the reference clock signals are generated by two or more reference clocks comprised on one or more of the backplane, one of the inserted modules, or an external system which is coupled to one of the inserted modules.

13. The instrumentation system of claim 1, wherein the plurality of instrumentation signaling lines include:
   a trigger bus, wherein the trigger bus comprises a plurality of trigger lines, wherein each of the plurality of trigger lines is operable to connect a respective one of the plurality of slots to the trigger bus, and wherein the trigger bus is operable to communicate trigger signals between the inserted modules.

14. The instrumentation system of claim 13, wherein the trigger bus comprises at least one open-collector signal line.

15. The instrumentation system of claim 1, further comprising:
   a star trigger controller slot, wherein the star trigger controller slot is operable to receive an inserted star trigger controller module;
   wherein the plurality of instrumentation signaling lines include a star trigger bus, wherein the star trigger bus comprises a plurality of dedicated trigger lines, each connecting the star trigger controller slot to one of the plurality of slots, wherein the star trigger bus is operable to communicate precision trigger signals between the inserted star trigger controller module and in each of the inserted modules in the plurality of slots.

16. The instrumentation system of claim 15, wherein at least a subset of said dedicated trigger lines comprise one or more differential triggers.

17. The instrumentation system of claim 15, wherein each of the dedicated trigger lines is of equal length to provide matched propagation times of the trigger signals.

18. The instrumentation system of claim 1, wherein the plurality of instrumentation signaling lines include a low voltage analog bus.

19. The instrumentation system of claim 1, wherein the plurality of instrumentation signaling lines include a high voltage analog bus.

20. The instrumentation system of claim 1, wherein the plurality of instrumentation signaling lines include one or more of:
   a local bus;
   system reference clock signals;
   a trigger bus; and
   a star trigger bus.

21. The instrumentation system of claim 1, wherein the plurality of instrumentation signaling lines include two or more of:
   a local bus;
   system reference clock signals;
   a trigger bus; and
   a star trigger bus.

22. The instrumentation system of claim 1, wherein the plurality of instrumentation signaling lines include three or more of:
   a local bus;
   system reference clock signals;
   a trigger bus; and
   a star trigger bus.

23. The instrumentation system of claim 1, wherein the plurality of instrumentation signaling lines include two or more of:
   a local bus;
   system reference clock signals;
   a trigger bus;

a star trigger bus;
a low voltage analog bus; and
a high voltage analog bus.

24. The instrumentation system of claim 1, further comprising:
one or more instrumentation modules, wherein each of the one or more instrumentation modules is operable to be inserted into a respective one of the plurality of slots, wherein the backplane is operable to logically couple to each of the one or more instrumentation modules when inserted into the slots;
wherein each of the one or more instrumentation modules is operable to perform instrumentation functions in the instrumentation system.

25. The instrumentation system of claim 1, further comprising:
a system controller slot, wherein the system controller slot is operable to receive an inserted system controller module, wherein the inserted system controller module is operable to provide system controller functions in the instrumentation system.

26. The instrumentation system of claim 25, wherein the system controller module comprises a computer module, wherein the computer module is operable to provide computer functions in the instrumentation system.

27. The instrumentation system of claim 25, wherein the system controller module comprises an interface for coupling to an external system.

28. The instrumentation system of claim 27, wherein the external system comprises a computer system.

29. The instrumentation system of claim 1, further comprising:
one or more additional chassis coupled to said chassis via a transmission medium, each of said additional chassis comprising:
a plurality of slots, wherein each of the plurality of slots is operable to receive an inserted module;
a backplane, comprising:
a switched fabric bus; and
a plurality of instrumentation signaling lines which provide instrumentation signaling functions;
a plurality of interface connectors coupled to the switched fabric bus and to the plurality of lines, wherein each of the connectors is operable to connect to a respective inserted module;
wherein the backplane is operable to provide for communication among the inserted modules.

30. The instrumentation system of claim 29,
wherein the plurality of signaling lines of said chassis are operable to transmit instrumentation signals through the transmission medium to said one or more additional chassis, and wherein the plurality of instrumentation signaling lines of said one or more additional chassis are operable to provide the instrumentation signals to one or more inserted modules in said one or more additional chassis.

31. The instrumentation system of claim 29,
wherein said plurality of signaling lines of each of said chassis and said one or more additional chassis are operable to communicate instrumentation signals through the transmission medium with any others of said chassis and said one or more additional chassis, thereby providing for communication between inserted modules of any of said chassis and said one or more additional chassis.

32. The instrumentation system of claim 29,
wherein the transmission medium comprises one or more transmission cables; and
wherein said chassis and said one or more additional chassis are daisy-chained together by said one or more transmission cables, respectively.

33. The instrumentation system of claim 29,
wherein the transmission medium comprises a network.

34. The instrumentation system of claim 33,
wherein the network comprises the Internet.

35. An instrumentation system, comprising:
a computer system;
a chassis;
a cable coupling the computer system and the chassis, wherein the cable transmits switched fabric bus signals between the computer system and the chassis;
wherein the chassis comprises:
a plurality of slots, wherein each of the plurality of slots is operable to receive an inserted module;
a backplane, comprising:
a switched fabric bus; and
a plurality of instrumentation signaling lines which provide instrumentation signaling functions;
a plurality of interface connectors coupled to the switched fabric bus and to the plurality of lines, wherein each of the connectors is operable to connect to a respective inserted module;
wherein the backplane is operable to provide for communication among the inserted modules.

36. The instrumentation system of claim 35, wherein the plurality of instrumentation signaling lines include one or more of:
a local bus;
system reference clock signals;
a trigger bus; and
a star trigger bus.

37. The instrumentation system of claim 35, wherein the plurality of instrumentation signaling lines include one or more of:
a local bus;
system reference clock signals;
a trigger bus;
a star trigger bus;
a low voltage analog bus; and
a high voltage analog bus.

38. The instrumentation system of claim 35,
wherein the switched fabric bus is a channel based switched fabric bus.

39. The instrumentation system of claim 38, wherein the channel based switched fabric bus is the InfiniBand bus.

* * * * *

UNITED STATES PATENT AND TRADEMARK OFFICE
CERTIFICATE OF CORRECTION

PATENT NO. : 6,981,086 B2  Page 1 of 1
DATED : December 27, 2005
INVENTOR(S) : Mark Wetzel et al.

It is certified that error appears in the above-identified patent and that said Letters Patent is hereby corrected as shown below:

<u>Column 6,</u>
Lines 21-22, delete "such as Rapid 10, developed by" and substitute -- such as Rapid IO, developed by --.

Signed and Sealed this

Twenty-third Day of May, 2006

JON W. DUDAS
*Director of the United States Patent and Trademark Office*